(12) United States Patent
Sarao et al.

(10) Patent No.: US 10,025,473 B2
(45) Date of Patent: Jul. 17, 2018

(54) ROOM PLAN GENERATION USER INTERFACE FOR ROOM PLAN SELECTION

(71) Applicant: Aditazz, Inc., Brisbane, CA (US)

(72) Inventors: Richard L. Sarao, San Francisco, CA (US); Andrew Pease, San Francisco, CA (US); Scott Ewart, Berkeley, CA (US)

(73) Assignee: ADITAZZ, INC., Brisbane, CA (US)

( * ) Notice: Subject to any disclaimer, the term of this patent is extended or adjusted under 35 U.S.C. 154(b) by 310 days.

(21) Appl. No.: 14/576,168

(22) Filed: Dec. 18, 2014

(65) Prior Publication Data

US 2016/0179342 A1    Jun. 23, 2016

(51) Int. Cl.
| | | |
|---|---|---|
| *G06F 3/048* | (2013.01) | |
| *G06F 3/0484* | (2013.01) | |
| *G06F 3/0482* | (2013.01) | |
| *G06F 17/50* | (2006.01) | |

(52) U.S. Cl.
CPC ........ *G06F 3/04842* (2013.01); *G06F 3/0482* (2013.01); *G06F 3/04847* (2013.01); *G06F 17/5004* (2013.01)

(58) Field of Classification Search
CPC .. G06F 3/04842; G06F 3/0483; G06F 3/0482; G06F 3/04847; G06F 17/5004
See application file for complete search history.

(56) References Cited

U.S. PATENT DOCUMENTS

| | | | |
|---|---|---|---|
| 6,506,056 B1 * | 1/2003 | DeMedio | G09B 25/04 434/72 |
| 6,859,768 B1 | 2/2005 | Wakelam et al. | |
| 7,496,487 B2 | 2/2009 | Wakelam et al. | |
| 8,327,315 B1 | 12/2012 | Ghosh et al. | |
| 8,537,156 B2 | 9/2013 | Sellem | |
| 2002/0035408 A1 * | 3/2002 | Smith | G06F 17/5004 700/97 |
| 2003/0172003 A1 | 9/2003 | Holbrook et al. | |
| 2004/0024624 A1 * | 2/2004 | Ciscon | G06F 17/5004 705/301 |
| 2005/0081161 A1 * | 4/2005 | MacInnes | G06F 17/5004 715/765 |
| 2005/0165793 A1 * | 7/2005 | Mosterman | G06F 8/10 |
| 2006/0047486 A1 | 3/2006 | Lebraut | |
| 2007/0249368 A1 | 10/2007 | Bailly et al. | |
| 2008/0077364 A1 | 3/2008 | Wakelam et al. | |
| 2008/0126022 A1 | 5/2008 | Hoguet | |
| 2008/0301546 A1 | 12/2008 | Moore et al. | |
| 2009/0024628 A1 * | 1/2009 | Angel | G03B 37/00 |
| 2009/0192647 A1 | 7/2009 | Nishiyama | |
| 2010/0145665 A1 | 6/2010 | Mujtaba et al. | |
| 2010/0245351 A1 * | 9/2010 | Sellem | G06F 17/5004 345/420 |
| 2010/0268513 A1 | 10/2010 | Loberg | |
| 2010/0325564 A1 | 12/2010 | Mital et al. | |

(Continued)

*Primary Examiner* — Kieu Vu
*Assistant Examiner* — Asteway T Gattew (57) ABSTRACT

A graphical user interface for displaying information related to room plan generation on a display device is disclosed. In the embodiment, the graphical user interface comprises a results window that displays a list of generated room plan configuration variants and a visualization window that displays at least one generated room plan configuration variant from the list of generated room plan configuration variants.

12 Claims, 9 Drawing Sheets

(56) References Cited

U.S. PATENT DOCUMENTS

| | | |
|---|---|---|
| 2011/0071805 A1 | 3/2011 | Pendyala et al. |
| 2013/0222393 A1 | 8/2013 | Merrell et al. |
| 2014/0276855 A1 | 9/2014 | de la Barrera et al. |
| 2014/0278274 A1 | 9/2014 | Osher et al. |
| 2015/0088579 A1 | 3/2015 | Gerphagnon et al. |
| 2015/0186352 A1 | 7/2015 | Greenwood |
| 2015/0294253 A1 | 10/2015 | Bhat |
| 2015/0363416 A1 | 12/2015 | Kritt et al. |

* cited by examiner

ROOM PLAN GENERATION USER INTERFACE FOR ROOM PLAN SELECTION

BACKGROUND

The process of bringing a building from concept to plan involves many different parties. For example, a new medical center may require management to conceive of building a medical center, doctors to enumerate features needed by various rooms in the medical center, architects to draw up an ideal example room plan for each of the various rooms based on the enumerated needed features, and then additional architects to adapt the ideal example room plans multiple times due to the space available at specific locations on various floors of a building.

In order to hasten the process, deviations from the ideal example room plans (i.e., adaptations) are sometimes unilaterally made by a single party without consultation from the other parties, which can result in conflict if the other parties object to the decision. For example, the architect adapting the ideal example room plan to the shape of the building may unilaterally decide to modify a room to accommodate a column, window, or an otherwise limited space. However, upon review, the doctors and/or management may object to the modification of the room because the modification has rendered the room unusable. If the modification is reviewed prior to building, the architect may only need to spend additional time making modifications to the adaptation but, if the modification is not reviewed until after construction is substantially complete, expensive repairs may be necessary.

Alternatively, if parties in the process are required to seek approval from all other parties for each decision or modification on a room-by-room basis, the process can become inefficient and delay the concept-to-plan process. For example, if an architect needs to consult the doctors and management before making modifications to the ideal example room plan using traditional techniques, the building plan could be delayed for days at a time if the various other parties are unavailable.

SUMMARY

In an embodiment, a graphical user interface for displaying information related to room plan generation on a display device is disclosed. In the embodiment, the graphical user interface comprises a results window that displays a list of generated room plan configuration variants and a visualization window that displays at least one generated room plan configuration variant from the list of generated room plan configuration variants.

In a second embodiment, a computer-implemented method for displaying information related to room plan generation on a display device is disclosed. In the embodiment, the computer-implemented method comprises displaying a results window that displays a list of generated room plan configuration variants and displaying a visualization window that displays at least one generated room plan configuration variant from the list of generated room plan configuration variants.

In a third embodiment, a display device for displaying information related to room plan generation via a graphical user interface is disclosed. In the embodiment, the graphical user interface comprises a results window that displays a list of generated room plan configuration variants and a visualization window that displays at least one generated room plan configuration variant from the list of generated room plan configuration variants.

Other aspects and advantages of embodiments of the present invention will become apparent from the following detailed description taken in conjunction with the accompanying drawings.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

As described above, the concept-to-plan process often involves multiple parties, which can plague the process with inefficiencies resulting from objectionable modifications. For example, correcting modifications made unilaterally by a single party or waiting for approval from multiple parties before a modification can be made can waste a significant amount of time. Ultimately, a more ideal approach would balance the need for input from all parties in the process against the need to streamline the process with unilateral decision making. Such a balanced approach would allow each party to provide valuable insight while ensuring that unilaterally made modifications will not be objectionable to other parties in the process. For example, the architect would only need to follow a set of rules compiled from input by the other parties in the process when making modifications rather than seek approval for each modification.

The approach of using a set of rules, as described above, can be facilitated by configuring parameters for an ideal example room plan, generating possible configuration variants based on the set of rules ("room plan generation"), and allowing the parties in the process to further select a pool of acceptable configuration variants from the generated possibilities. Then, when an architect needs to modify the ideal example room plan, the architect can select an acceptable configuration variant from the pool of room plans that meets the architect's needs with confidence that the configuration variant will not be objected to by another party in the process. Accordingly, the approach allows the architect to enjoy the efficiency of unilateral decisions while still benefitting from the input of the other parties in the process.

In an embodiment, a configuration variant is a variation of the ideal example room plan. A configuration variant can vary from the ideal example room plan by the placement of room components (e.g., furniture and fixtures such as chairs and sinks) and physical structures (e.g., support structures such as columns and windows) within the room, by the particular size dimensions of the room, as well as by other parameters such as lighting, electrical wiring, or plumbing. For example, a configuration variant can indicate that a handwash station is placed on the left wall, an exam table is placed on the right wall, a structural column is located in the "top right", and that the room is ten feet by twelve feet with a water hook-up on the left wall.

In an embodiment, the above-described approach is facilitated by a Room Library Synthesis (RLS) system that includes an RLS user interface. In an embodiment, the RLS user interface can be part of a system for realizing a building system as disclosed in U.S. Pat. Pub. No. 2012/0239353, filed Mar. 19, 2013. In an embodiment, the RLS user interface includes a configuration user interface, a selection user interface, and a rules user interface. The configuration user interface displays information and receives input related to room plan generation, the selection user interface displays possible configuration variants of generated room plans based on the received input and displays parameters of generated room plans, and the rules user interface displays information and receives input related to special placement rules.

Figure 1:
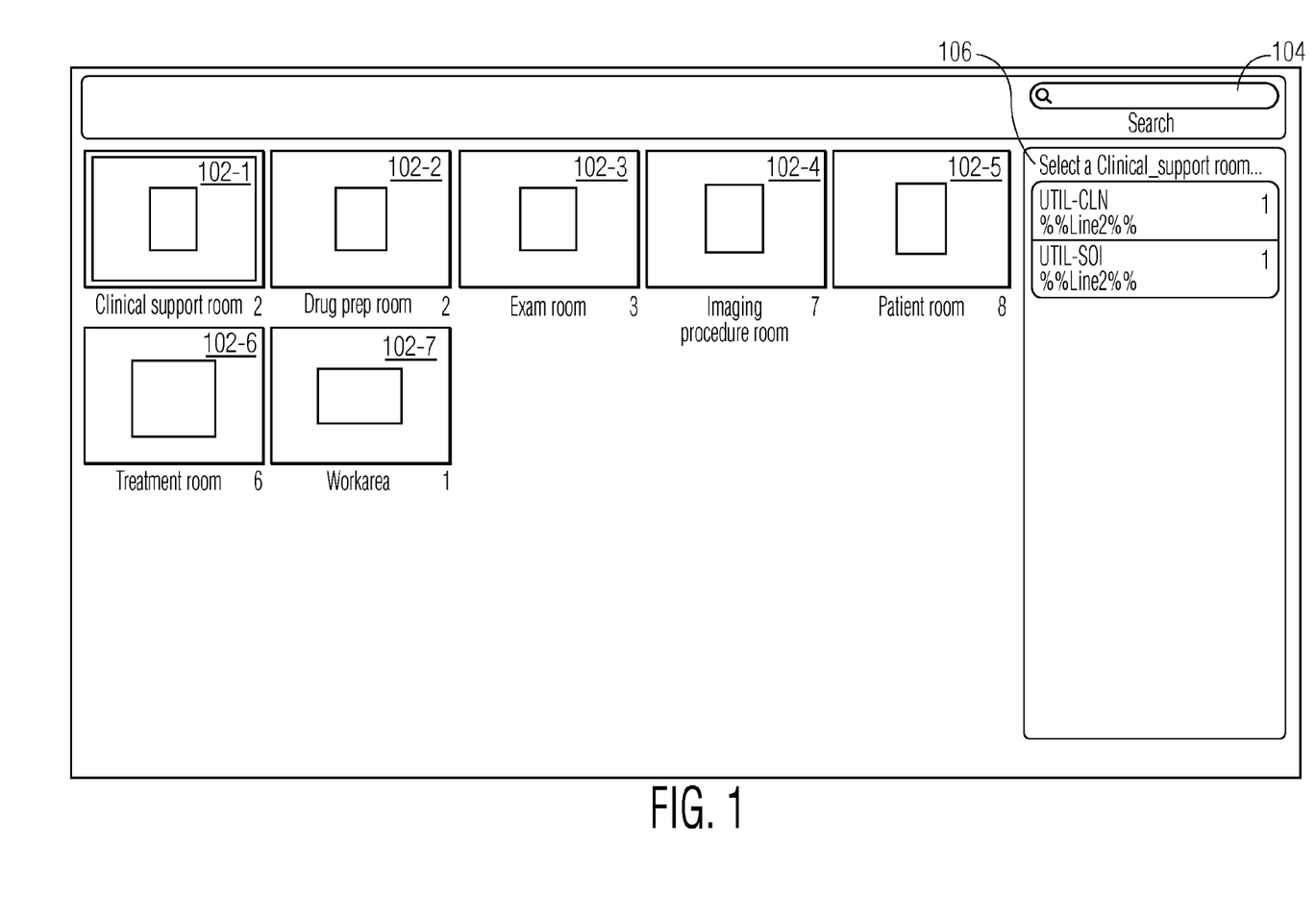
FIG. 1 is an embodiment of a graphical user interface for base room selection.

In an embodiment, the RLS user interface initially displays various base rooms that can be used by parties in the process to further build rules for an ideal example room plan. FIG. 1 is an embodiment of a graphical user interface for base room selection. The graphical user interface of FIG. 1 offers seven different base room categories including a Clinical support room category 102-1, a Drug prep area category 102-2, an Exam Room category 102-3, an Imaging Procedure Room category 102-4, a Patient Room category 102-5, a Treatment Room category 102-6, and a Workarea category 102-7. In other embodiments, more or less than seven base room categories can be offered. In an embodiment, base room categories are organized in a hierarchical framework of function categories and subfunction categories, which allows for rules and input parameters to be applied to room plans within the categories. The interface also includes a search box 104 as well as an index of previously generated room plan variants 106. In the embodiment, the graphical user interface displays the seven different base room categories as selectable items and, upon selection of a category by a user, the graphical user interface displays the various base room templates for that category (not shown). For example, upon selection of the Clinical support room category, the graphical user interface displays the various base room templates for Clinical support rooms as selectable items. In an embodiment, the number of base room templates available for a category is indicated by the number beside the category name. For example, the Clinical support room category has two base room templates available for selection as indicated by the number "2" beside the category name. Thus, when the clinical support category is selected, the graphical user interface displays two Clinical support room templates.

Configuration User Interface

Once a base room template has been selected, the configuration user interface is displayed in order to facilitate further configuration of the base room template into an ideal example room plan. In an embodiment, the configuration user interface utilizes a rules window and a visualization window to receive input related to room plan generation. The rules window includes a design rules tab and a generation configuration rules view that can be used to receive input from the parties in the process regarding acceptable configuration variants of the ideal example room plan. The visualization window provides visualizations of room components selected in the rules window to be included in the ideal example room plan as well as physical limitations of those components (e.g., dimensions, clearance, aesthetics, etc.).

Figure 2:
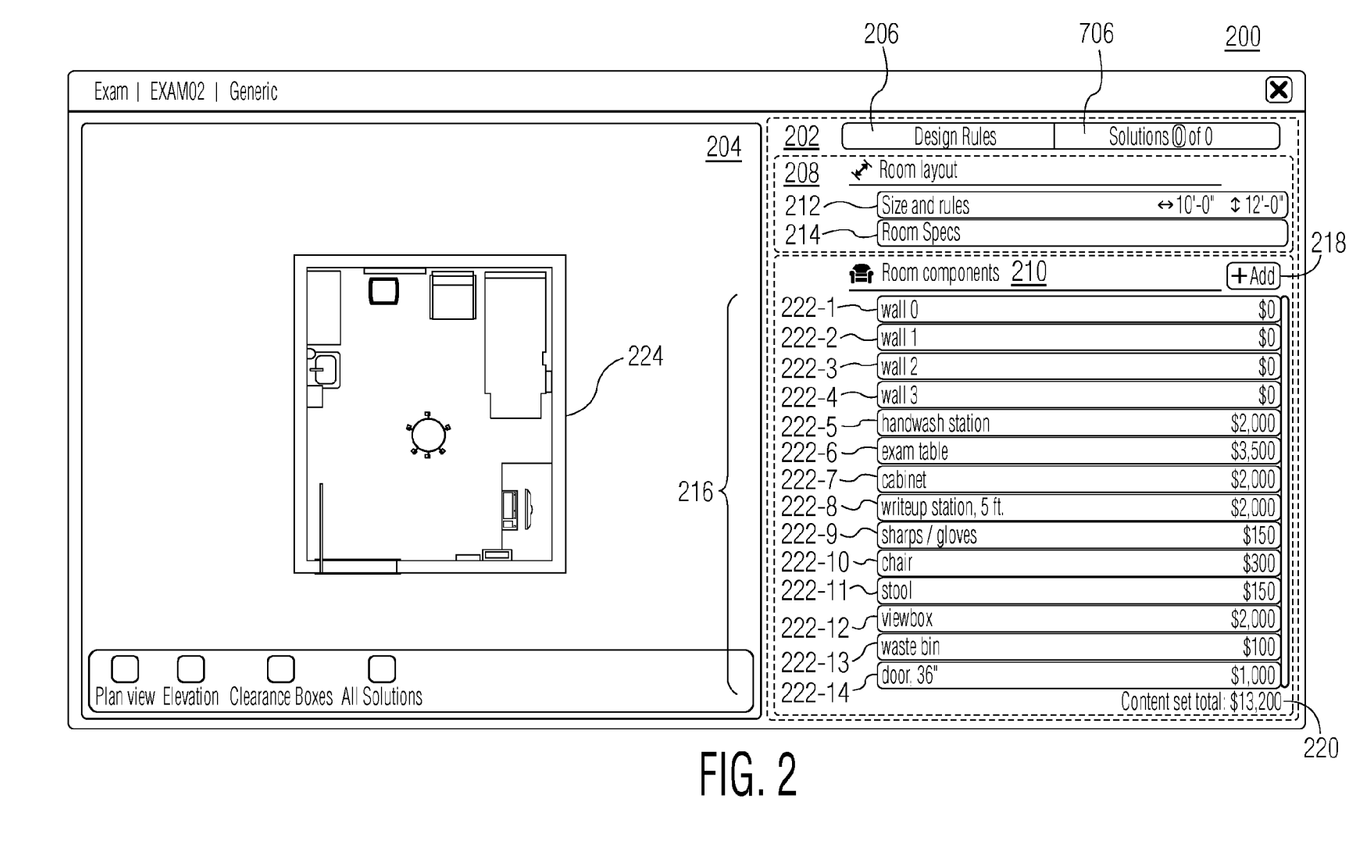
FIG. 2 is an embodiment of a configuration user interface that includes a rules window, having a design rules tab and a solutions tab, and a visualization window.

FIG. 2 is an embodiment of the configuration user interface that includes a rules window 202, having a design rules tab 206 and a solutions tab 706, and a visualization window 204. The solutions tab is described in more detail below with reference to FIG. 7. In the embodiment of FIG. 2, the design rules tab is selected, causing a room layout section 208 and a room components section 210 to be displayed. The room layout section of the rules window includes a "Size and rules" button 212 and a "Room Specs" field 214. In the room layout section, the dimensions of the ideal example room plan can be specified by clicking on the "Size and rules" button, which causes a generation rule configuration view as described with reference to FIG. 3 to be displayed, and inputting the dimensions. Once specified, the text of the "Size and rules" button can be updated to indicate the specified dimensions for the ideal example room plan. For example, in the embodiment of FIG. 2, the width has been specified as 10' and the length as 12' as displayed in the "Size and rules" button. Additional details can also be specified by clicking on the "Size and rules" button. In an embodiment, the additional details can be displayed in the "Size and rules" button as well as in the "Room Specs" field.

The room components section 210 of the rules window 202 includes text boxes 222-1-222-14 that correspond to room components that have been added to a base room plan, an "+Add" button 218, and a content set total text box 220 that displays the total cost amount for the room components corresponding to the text boxes added to the room components section. Text boxes corresponding to room components that have been added to the selected base room template are displayed in the room components section and the associated cost for each room component is displayed in the corresponding text box. For example, in FIG. 2, the list includes a text box corresponding to handwash station 222-5 and indicates that the cost of the handwash station is two thousand dollars. Additional text boxes corresponding to room components can be added to the list from a library of text boxes by clicking on the "+Add" button. In an embodiment, clicking on the "+Add" button opens a menu of selectable text boxes populated from the library (not shown). The total cost amount for the room components corresponding to the text boxes included in the room components section is displayed at the bottom of the room components section.

In an embodiment, the library of text boxes is a library of profiles for room components that can be added to a room. The profile for each component in the library includes information such as the dimensions, cost, and/or clearance of the room component. For example, the profile for a 36" door may include information that the door is eight feet by three feet, requires a half-circle of open space having a 3 foot diameter from the door jam, and that the door costs one thousand dollars.

In an embodiment of the configuration user interface 200, the visualization window 204 displays a base room template 224 populated with room components corresponding to the text boxes 222-1-222-14 listed in the room components section 210 of the rules window 202. In an embodiment, the RLS system automatically populates the base room template in the visualization window with room components corresponding to the text boxes. A user can then position the room components within the base room template using, for example, a drag-and-drop technique. In another embodiment, the room components can be positioned within the base room template automatically by the RLS system. Additional functionality of the visualization window is described below with reference to FIG. 5.

Figure 3:
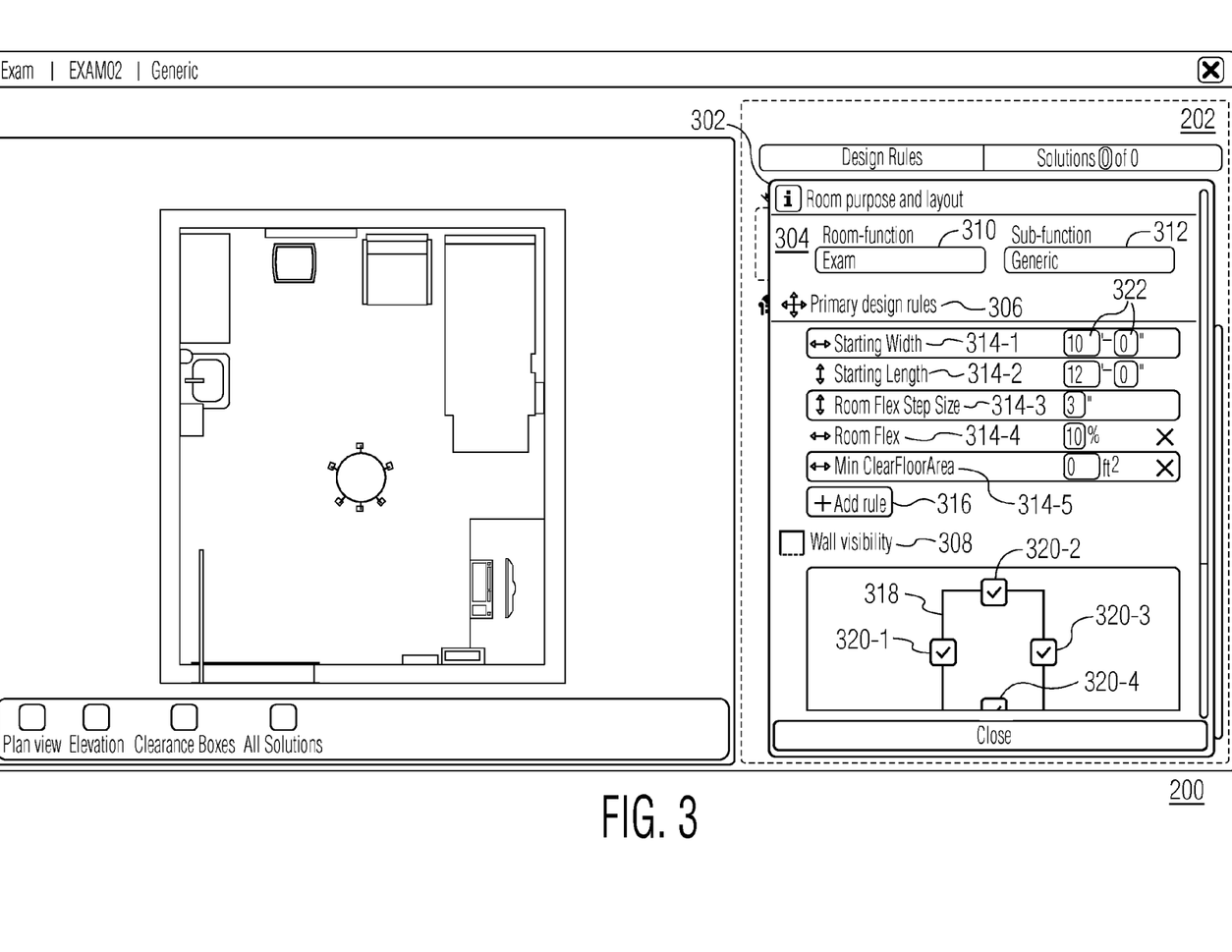
FIG. 3 is an embodiment of a configuration user interface when a generation rule configuration view is displayed in the rules window.

In an embodiment, when the "Size and rules" button 212 of the rules window 202 is clicked on, a generation rule configuration view opens over the room layout and room components sections 208 and 210 in the rules window. FIG. 3 is an embodiment of the configuration user interface 200 when a generation rule configuration view 302 is displayed in the rules window. As shown in FIG. 3, the generation rule configuration view has a room function section 304, a primary design rules section 306, and a wall visibility section 308. The room function section includes a mutable room function field 310 and a mutable sub-function field 312 that allow the user to designate a room function and a sub-function to be associated with the ideal example room plan. For example, if a generic template is chosen from the Exam base room template category, as described with reference to FIG. 1, then the associated room function of the ideal example room plan will be set to "Exam" and the sub-function will be set to "Generic." Other room functions include, for example, the base room categories of FIG. 1 and other sub-functions include, for example, the templates for the base room categories. The primary design rules section includes a series of primary design rule indicators 314-1-314-5. Primary design rule indicators allow the user to specify rules on which the generation of configuration variants of the ideal example room plan will be based ("generation rules"). Generation rules can be specified by adding one or more primary design rule indicators, which correspond to generation rules, to the primary design rules section. For example, a user can specify a generation rule regarding the minimum amount of clear floor area that must be maintained by adding a minimum clear floor area indicator to the primary design rules section. Primary design rules indicators can include, for example, primary design rule indicators corresponding to rules such as a starting width of the room 314-1, a starting length of the room 314-2, a room flex step size by which the width and/or length can be increased and/or decreased in each configuration variant 314-3 (e.g., when set to 3", the width and/or length of the room can be increased or decreased by 3" increments until another generation rule is violated), a percentage by which the area of the room is allowed to change 314-4, and/or a minimum amount of clear floor area 314-5 (e.g., when set to "10", at least 10 ft$^2$ of space must remain unoccupied after considering the clearance needed by listed room components). Additional primary design rule indicators can be added to the primary design rules section by clicking the "+Add rule" button 316, which causes a displayed list of additional primary design rule indicators to open over the generation rule configuration view. In an embodiment, once added, primary design rule indicators include a mutable field for receiving an input used by the rule corresponding to the primary design rule indicator. For example, in FIG. 3, the primary design rule indicator corresponding to the generation rule that sets the starting width of the room 314-1 has fields 322 for feet and inches and the values input into the mutable fields are used as the starting width of the room when generating room plan configuration variants.

In an embodiment, the wall visibility section 308 includes an outline of the base room template 318 and a selection indicator 320-1-320-4 for each wall of the outline. Selecting the selection indicators allows the user to specify the number of walls to include during the generation of configuration variants. For example, if a user wants to generate configuration variants in which a room has three solid walls and a fourth wall formed by a movable curtain, then the selection indicator corresponding to the fourth wall may be unchecked to remove the wall when generating configuration variants.

Figure 4:
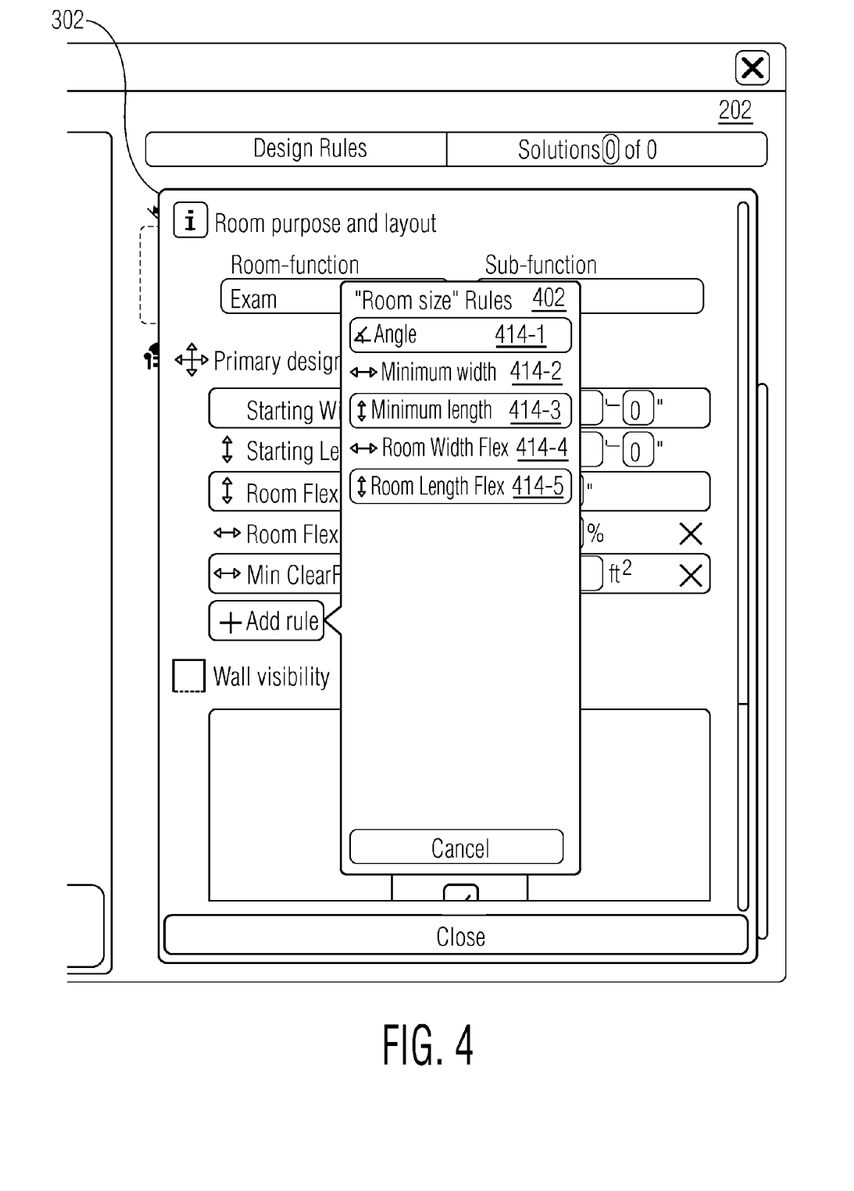
FIG. 4 is an embodiment of the generation rule configuration view of FIG. 3 in a state configured for adding additional primary design rule indicators.

As described with reference to FIG. 3, additional primary design rule indicators can be added to the primary design rules section 306. FIG. 4 is an embodiment of the generation rule configuration view 302 of FIG. 3 in a state configured for adding additional primary design rule indicators after the "+Add rule" button 316 has been clicked. In such a state, the generation rule configuration view includes a displayed list of additional primary design rule indicators 402 that opens over the other sections of the generation rule configuration view. Additional primary design rule indicators include, for example, primary rule indicators corresponding to rules such as an allowed wall angle 414-1 (e.g., when set to 0 all walls must be perpendicular to each other), a minimum width to which the room width can be decreased 414-2, a minimum length to which the room length can be decreased 414-3, a percentage or linear distance by which the width of the room is allowed to change 414-4, and a percentage or linear distance by which the length of the room is allowed to change 414-5. In an embodiment, once an additional primary design rule indicator has been added to the primary design rules section, the indicator becomes a primary design rule indicator that is displayed in the primary design rules section 306 of FIG. 3. For example, the primary design rule indicators 314-1-314-5 of FIG. 3 could have been added to the primary design rules section by selecting the corresponding additional primary design rule indicators from the displayed list of additional primary design rule indicators.

Figure 5:
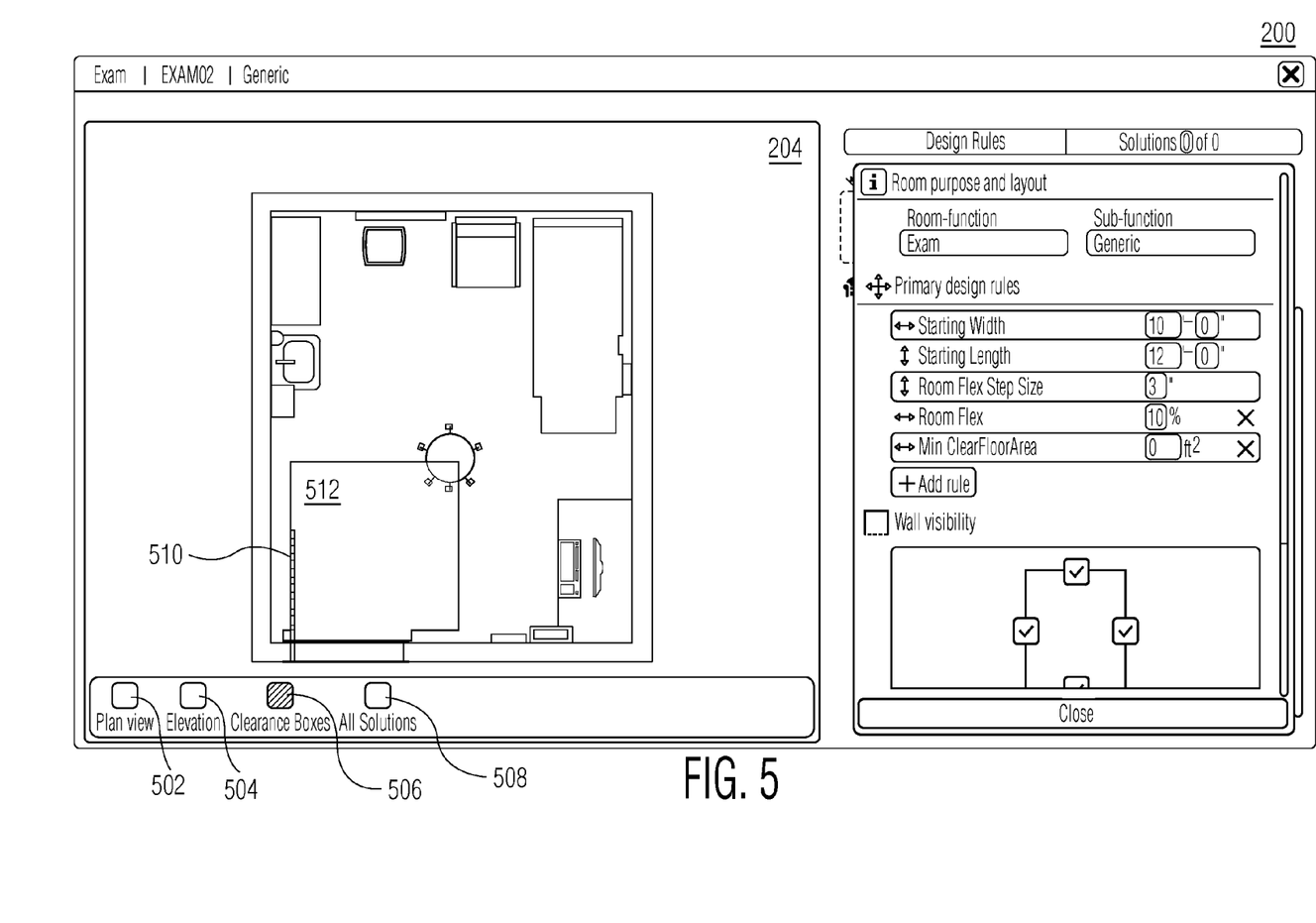
FIG. 5 is an embodiment of the configuration user interface when a different visualization of the room components is displayed.

In addition to allowing a user to position room components within a room, the visualization window can display multiple visualizations of room plans including the room components within a room template. FIG. 5 is an embodiment of the configuration user interface 200 when a visualization of the room components, different from the visualizations displayed in FIGS. 2 and 3, is displayed. In the embodiment of FIG. 5, the visualization window includes a plan view button 502, an elevation button 504, a clearance boxes button 506, and an all solutions button 508. Clicking the plan view button causes the visualization window to display a plan view of a base template and room components within the base template as described above with reference to FIG. 2. Clicking the elevation button causes the visualization window to reorient the visualization of the populated base room template such that the base room template and the room components positioned within the template are displayed in a 2D elevation view such that the heights of room components are visually indicated. Clicking the clearance boxes button causes the visualization window to graphically indicate the area needed by each room component. The area needed by each room component can be indicated by any geometrical shape (e.g., square, circle, or any amorphous shape). In an embodiment, the area needed by each room component is the area needed to interact with each room component rather than just the exact dimensions of each room component. For example, in FIG. 5, a door 510 has a displayed clearance box 512 that covers the floor space needed to operate the door despite the static footprint of the door being considerably smaller. That is, the area needed by the door is determined by the amount of area needed to interact with the door (e.g., clearance area) rather than just the exact dimensions of the door. Clicking the all solutions button causes the visualization window to display possible room configuration variants (not shown) based on the primary design rules input by the user and the selected base room plan. In an embodiment, variants having rule violations are shown as gray boxes to alert a user that a rule violation has occurred.

Once the ideal example room plan is configured by adding primary design rule indicators and positioning room components as described above, the corresponding generation rules are applied to the ideal example room plan by an RLS tool that performs multiple reconfigurations of the ideal example room plan. The RLS tool reconfigures the ideal example room plan using the user defined increments and captures each reconfiguration as a configuration variant of the ideal example room plan in a pool of room plan configuration variants. In an embodiment, the RLS tool reconfigures the ideal example room plan and creates a pool of configuration variants in two passes. In the first pass, the RLS tool holds the width of the room constant and increases/decreases the length of the room by a user defined increment (e.g., the room flex step size) until a generation rule is reached (e.g., until the Room Flex percentage is reached). In the second pass, the tool holds the length of the room constant and increases/decreases the width of the room by a user defined increment until a generation rule is reached. After each increase or decrease, rule violations are identified and the reconfiguration of the ideal example room plan is captured and added to the pool of configuration variants. If a room plan results in a clash between room components (i.e., the clearance boxes of room components overlap) or if another generation rule is violated, then the room plan will be included in the pool of configuration variants but, in an embodiment, displayed as a gray box.

Selection User Interface

Once the pool of configuration variants has been generated, the pool of configuration variants is displayed by the RLS tool in a selection user interface of the RLS user interface. In an embodiment, the selection user interface utilizes a results window and a visualization window to display room plans in the pool of room plan configuration variants generated from the ideal example room plan and generation rules. The results window includes a design rules tab and a solutions tab that can be used to display the generation rules and various properties of the configuration variants in the pool of room plan configuration variants. The visualization window provides visualizations of room dimensions and room components in each configuration variant in the pool of room plan configuration variants.

Figure 6:
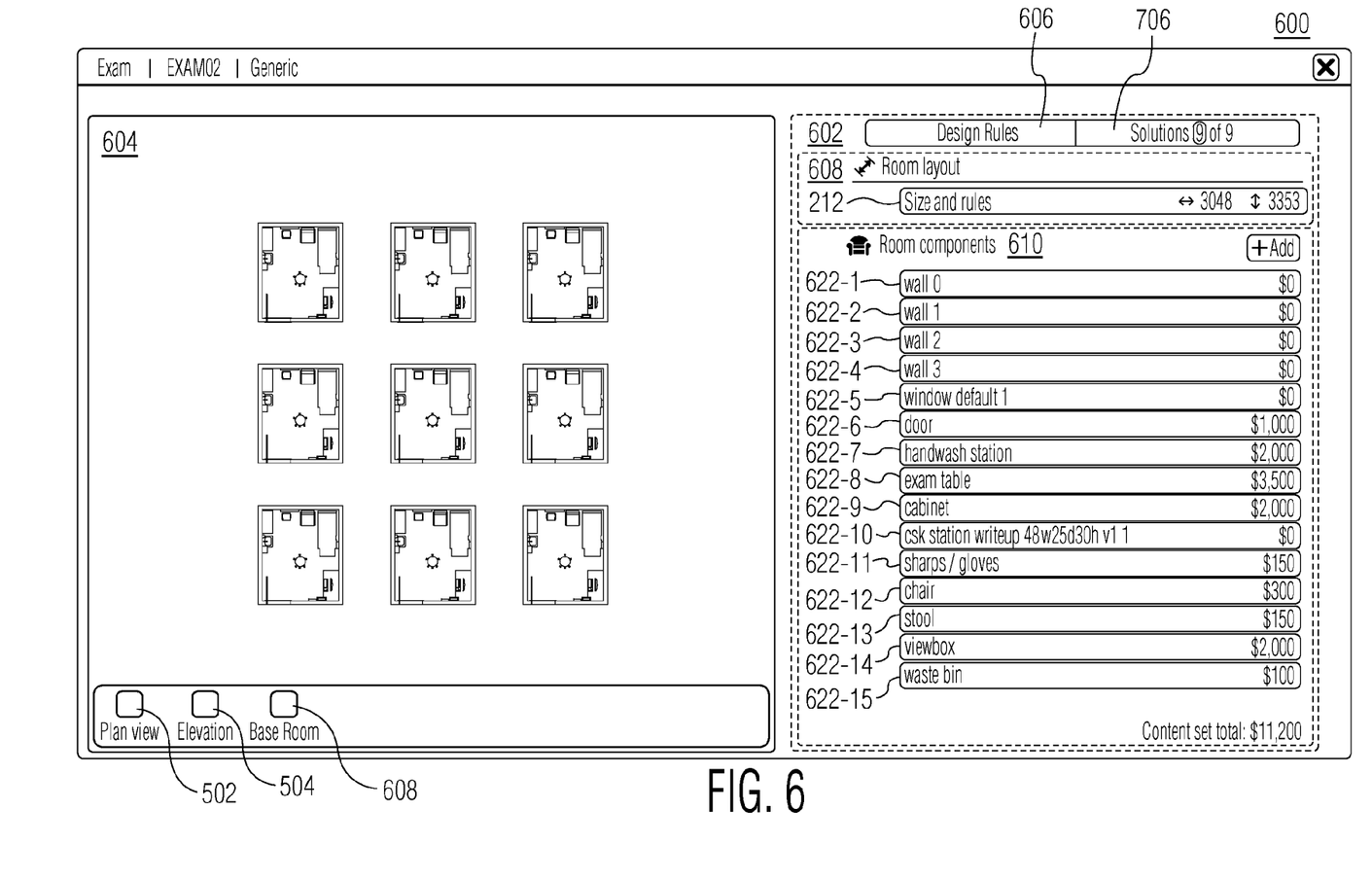
FIG. 6 is an embodiment of a selection user interface that includes a results window, having a design rules tab and a solutions tab, and a visualization window.

FIG. 6 is an embodiment of the selection user interface 600 that includes a results window 602, having a design rules tab 606 and a solutions tab 706, and a visualization window 604. The solutions tab is described in more detail below with reference to FIG. 7. Similar to selecting the design rules tab 206 described with reference to FIG. 2, selecting the design rules tab of FIG. 6 causes the results window to display of a room layout section 608 and a room components section 610. In the room layout section, the ideal example room plan dimensions are displayed in the "Size and rules" button 212. In the room components section 610, previously added text boxes 622-1-622-15 corresponding to room components are displayed. In an embodiment, each text box indicates the cost of the room component corresponding to the text box and a total cost for the room components corresponding to the text boxes in the room components section is displayed in the lower right corner of the room components section. A user can update the room dimensions and can add additional room components in the same manner as described with reference to FIG. 2, at which point, the RLS tool performs the reconfigurations again and updates the pool of room configuration variants.

Similar to the visualization window of FIG. 2, the visualization window 604 of the selection user interface includes visualizations of configuration variants in the pool of room plan configuration variants along with a plan view button 502, an elevation button 504, and a base room button 608. In an embodiment, nine visualizations of configuration variants from the pool of room plan configuration variants are shown at a time and a user can scroll down within the visualization window to display additional configuration variants from the pool. In an embodiment, more or less than nine configuration variants can be shown at a time and additional configuration variants can be displayed by scrolling within the visualizations window. As described above, the visualization window can display multiple visualizations of the room components within each configuration variant in the pool of room plan configuration variants. The different visualizations (e.g., elevation) can be displayed by clicking the plan view button or the elevation button. Clicking the plan view button causes the visualization window to display plan views of the configuration variants in the pool of room plan configuration variants. Clicking the elevation button causes the visualization window to reorient the displayed visualizations into 2D plans views of a wall in a room. Clicking the base room button causes the visualization window to display the ideal example room plan.

Figure 7:
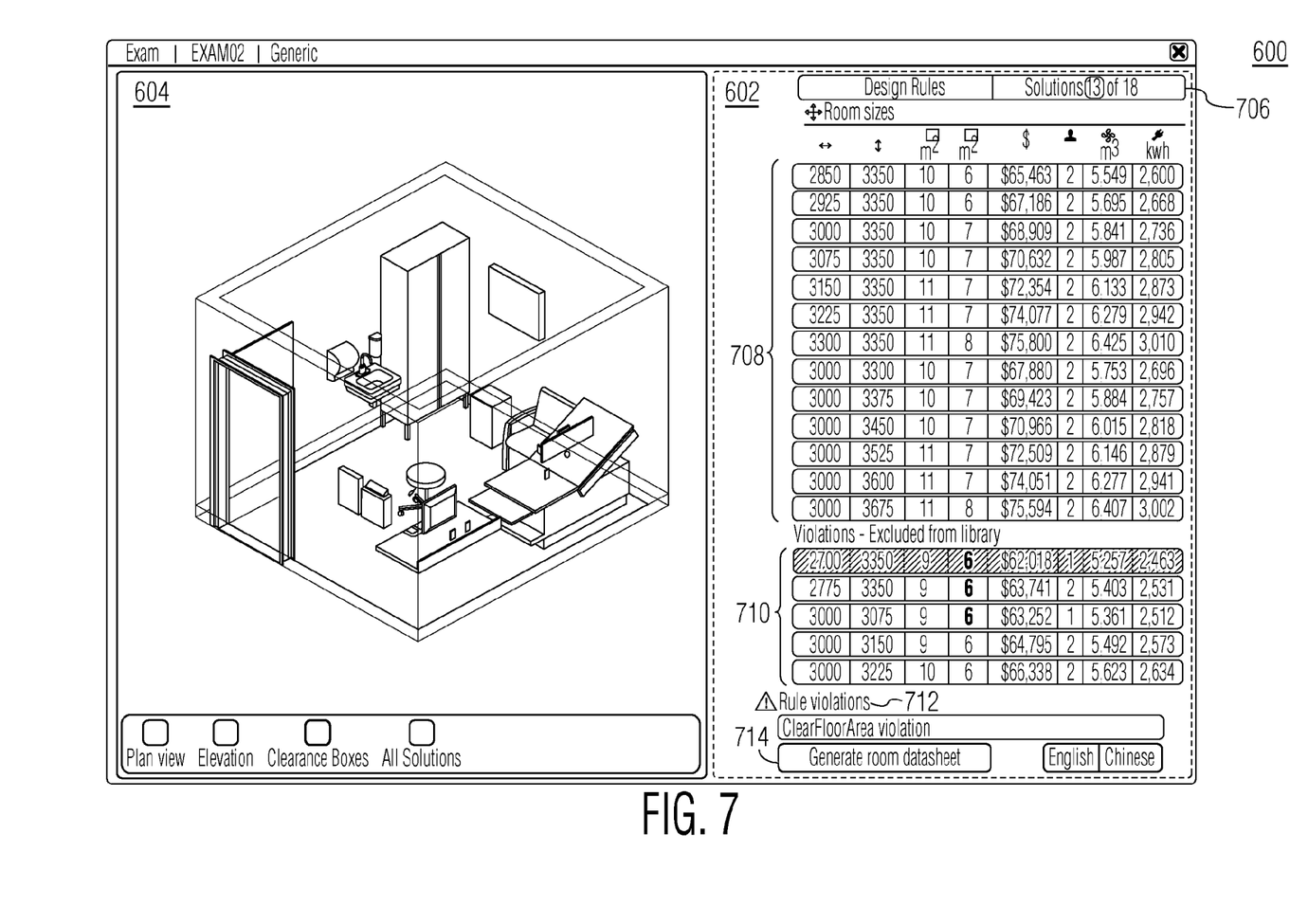
FIG. 7 is an embodiment of a selection user interface when the solutions tab is selected in the results window.

FIG. 7 is an embodiment of the selection user interface 600 when the solutions tab 706 is selected in the results window 602. When the solutions tab is selected, the results window displays a list of generated room plan configuration variants divided into possible room plans 708 (i.e., room plans in the pool of room configuration variants that satisfy all the generation rules) and violating room plans (i.e., room plans excluded from the pool or room configuration variants that violate one or more of the generation rules) 710, a rule violations indicator 712, and a "Generate room datasheet" button 714. In an embodiment, each entry in the list displays room plan specifications including the width of the room, the length of the room, the occupied floor area, the unoccupied floor area, the total cost of the room, the intended occupancy of the room, the ventilation area, and the power demand of the room. In an embodiment, when an entry in the list of generated room plan configuration variants is selected, the entry is visualized in the visualization window. As illustrated in FIG. 7, an elevation view of a selected entry is visualized in the visualization window. Both possible and violating room plans can be visualized and, if a violating room plan is selected, the rule or rules violated will be indicated by the rule violations indicator. For example, if a violating room plan that violates a minimum clear floor area generation rule is selected, then the rule violations indicator will display text indicating that the minimum clear floor area generation rule has been violated. Additionally, room plan specifications can be, for example, colored, bolded, italicized, or shaded to indicate a violated generation rule. In FIG. 7, the unoccupied floor area of a selected room plan violates the minimum clear floor area generation rule and is bolded to indicate the violation.

Once acceptable possible room plans have been selected, a room datasheet can be generated that includes the acceptable possible room plans that an architect can choose from when designing the building. For example, in FIG. 7, once the acceptable possible room plans have been identified, a user can click the "Generate room datasheet" button 714 to generate the room datasheet for use by the architect. In an embodiment, the room datasheet includes the specifications and measurements (e.g., mechanical, electrical, plumbing, etc.) of all the acceptable possible room plans.

Thus, by visualizing a configuration of an ideal example room plan and then visualizing configuration variants of the ideal example room plan, the graphic user interface allows parties in the concept-to-plan process to quickly and easily see what possible configuration variants of room plans will look like and to generate a datasheet of acceptable possible room plans that the architect can unilaterally decide to use when designing a building. Accordingly, time wasted by redesigning the building in response to objections can be avoided without requiring multiple party input on each modification needed to design the building.

Rules User Interface

In a further embodiment, a user may want to specify additional special room component placement needs for various room components. For example, a user may want to specify that a handwash sink and a cabinet must be placed on the same wall or that an exam table must be placed on the wall opposite the door. In an embodiment, the RLS user interface further comprises a rules user interface in order to facilitate user input of special placement rules.

Figure 8:
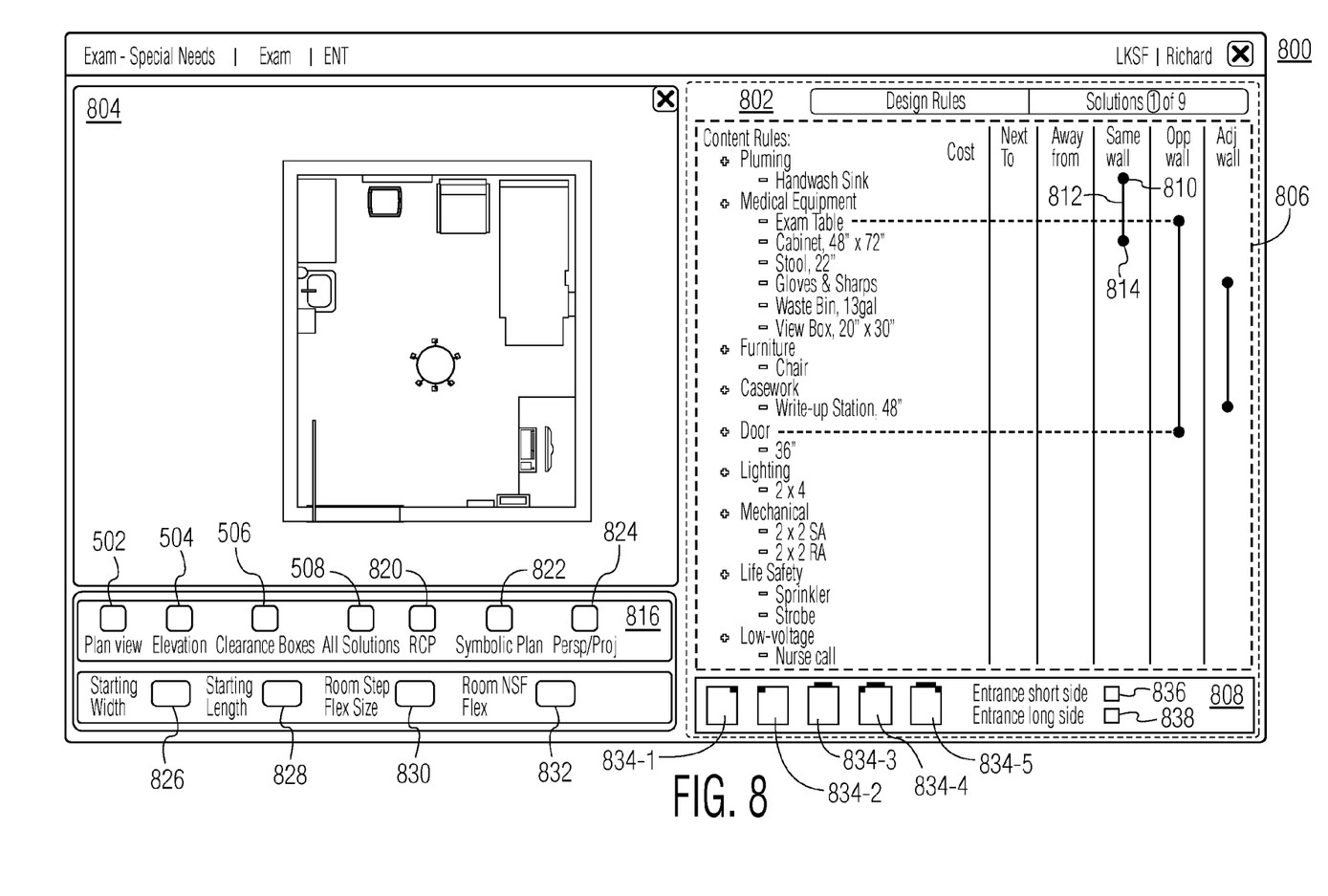
FIG. 8 is an embodiment of a rules user interface.

FIG. 8 is an embodiment of a rules user interface 800. The rules user interface includes a content window 802 as well as a visualization window 804. The content window includes a rules grid 806 and a physical structure toolbar 808. The rules grid is a grid in which rows are populated by a categorical listing of the room components added to the ideal example room plan and columns are populated by special placement rules. A user can then connect two or more room components (visually displayed, for example, with endpoints and a connecting element, such as a line) within a column to define a special placement rule that applies to the two or more room components. For example, in FIG. 8, an endpoint 810 corresponding to the handwash sink in the "same wall" column is connected with a line 812 to an endpoint 814 corresponding to the cabinet also in the "same wall" column. Thus, a special placement rule is visually indicated and applied to the handwash sink and the cabinet that requires the two room components to be located on the same wall. In an embodiment, more than two components can be connected, more than one connecting element can exist in the same column, and room components can have an endpoint in more than one column.

In addition to facilitating user input of the special placement rules, in an embodiment, the rules user interface 800 also facilitates the placement of physical structures, such as support structures (e.g., columns), windows, and doors, within an ideal example room plan via the physical structure toolbar 808. The physical structure toolbar includes an array of predefined possible placements for physical structures 834-1-834-5. A predefined possible placement for physical structures indicates the physical position of at least one of support structures, windows, and doors within a room plan. For example, the first possible placement 834-1 illustrates a column in the northeast or "top right" corner of the room while the last possible placement 834-5 illustrates a column in the northeast corner and a window centered on the northern or "top" wall. The location of a room entrance can be indicated by the entrance checkboxes 836, 838 in the toolbar by checking the box corresponding to the desired entrance placement. In an embodiment, a user can toggle which possible placements for physical structures should be included in the generation processes by clicking on desired possible placements. For example, if a user determines that a physical structure can be placed on a right side and a left side of a room, then a user will click the predefined possible placements labeled 834-1 and 834-2 and then the room plan generator will generate configuration variants in which a physical structure is on the right side of a configuration variant and configuration variants in which a physical structure is on the left side of a configuration variant.

Similar to the visualization window described with reference to FIG. 2, the visualization window 804 shown in FIG. 8 displays the ideal example room plan populated by the room components listed in the categorical listing of the rules grid 806 in a placement reflective of the defined special placement rules (e.g., the handwash sink and the cabinet are placed on the same wall). Additionally, when a predefined possible placement for physical structures 834-1-834-5 is selected or when the location of a room entrance is indicated in the physical structure toolbar 808, the visualization window displays a room plan having the physical structures physically positioned as indicated by the selected predefined possible placement for physical structures. The visualization window also has a visualization window toolbar 816 that includes a plan view button 502, an elevation button 504, a clearance boxes button 506, and an all solutions button 508 as described above with reference to FIG. 5. Additionally, the visualization window toolbar includes an RCP button 820, a Symbolic plan button 822, a persp/proj button 824, a starting width field 826, a starting length field 828, a room step flex size field 830, and room NSF flex field 832. The RCP button displays a view of the ceiling, the symbolic plan button displays a traditional architectural plan view (e.g., blueprint-style plan), and the persp/proj button allows a user to toggle between displaying a projected plan view and a 3D perspective view. The various buttons and fields included in the visualization window toolbar can be selected or filled to cause the user interface to display multiple views of the ideal example room plan.

Figure 9:
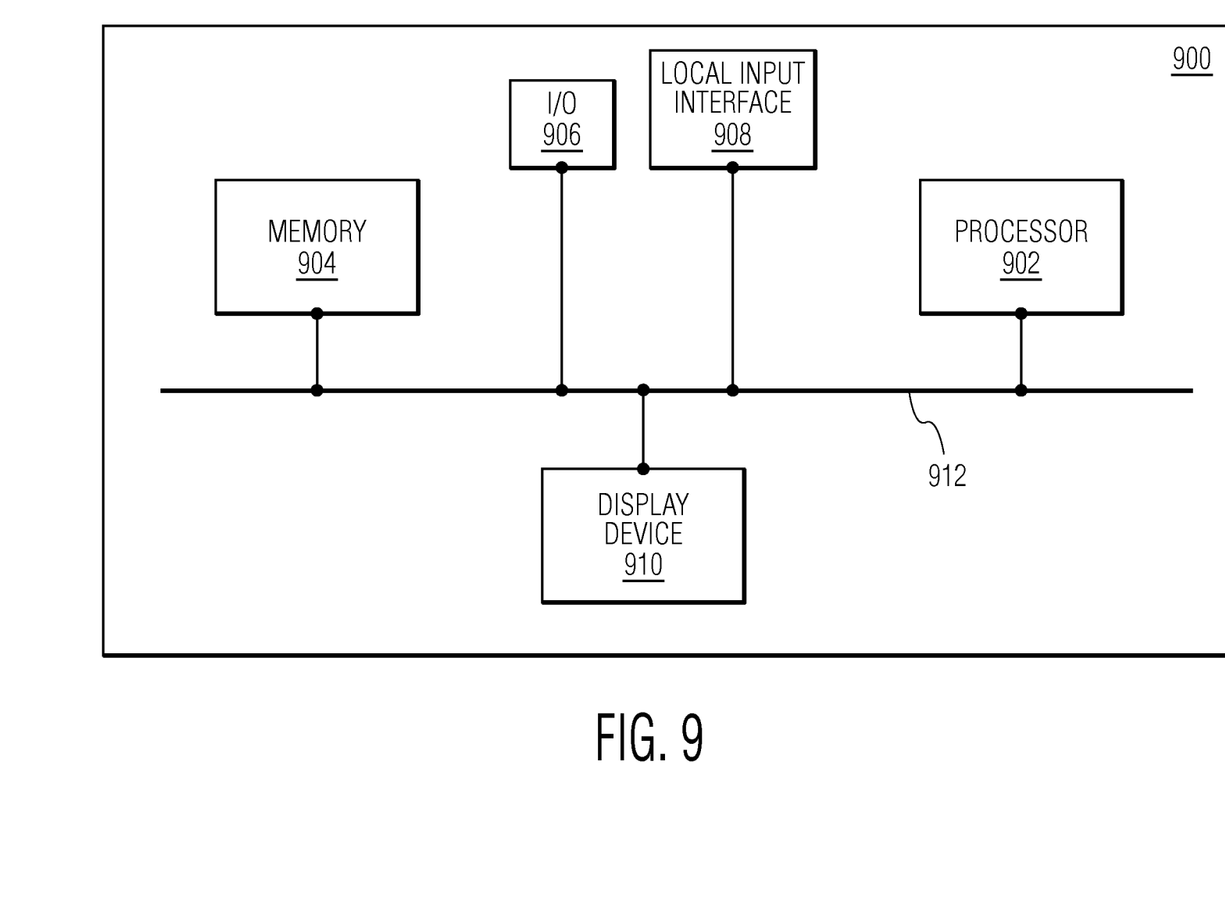
FIG. 9 illustrates a computer having a display device on which the user interfaces of FIGS. 1-8 can be displayed.

In an embodiment, the graphic user interfaces described with reference to FIGS. 1-8 can be displayed on a display device of a computer. FIG. 9 illustrates a computer 900 having a display device 910 on which the user interfaces of FIGS. 1-8 can be displayed. The computer includes a processor 902, memory 904, an I/O interface 906, a local input interface 908, and the display device, which are interconnected by a data bus 912. In an embodiment, the processor may include a multifunction processor and/or an application-specific processor. Examples of processors include the PowerPC™ family of processors by IBM and the x86 family of processors by Intel such as the Xeon™ family of processors and the Intel X5650 processor. The memory within the computer may include, for example, storage medium such as read only memory (ROM), flash memory, RAM, and a large capacity permanent storage device such as a hard disk drive. The I/O interface enables input from other computers via, for example, Firewire, Ethernet, or USB and the local input interface enables input from, for example, a local user via a keyboard, mouse and/or touch inputs.

The computer 900 executes computer readable instructions stored in the memory 904 using the processor 902 to cause the graphical user interfaces described above to be displayed on the display device 908. In an embodiment, the display device is a touch display that can receive input signals from a user via touch commands in addition to input signals received from the I/O interface 906 and the local input interface 908. Inputs received by the computer (e.g., via the local input interface or via the I/O interface) can be transmitted to the processor and memory to cause the above-described graphical user interfaces to be displayed.

In an embodiment, the display device 908 can be integrated into the computer 900, as illustrated in the embodiment of FIG. 9 (e.g., a laptop or tablet computer). Alternatively, the display device can be an external display device that communicates with the computer over a graphical input/output interface, such as a monitor attached by an HDMI cable to a desktop computer or to a network server (not shown).

In an embodiment, a "tab" refers to a button or toggle that, when clicked or otherwise interacted with, causes the various graphical user interfaces described above to be displayed. In another embodiment, tabs or toggles may be implemented as graphical icons that a user can interact with to cause the various graphical user interfaces to be displayed.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods may be implemented using software instructions stored on a non-transitory computer-readable storage medium for execution by a computer. As an example, an embodiment of a computer program product that performs some of the operations described herein may include a non-transitory computer-readable storage medium that stores a computer readable program that, when executed on a computer, causes the computer to perform operations, as described herein.

Furthermore, embodiments of at least portions of the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The computer-useable or computer-readable medium can be an electronic, magnetic, optical, electromagnetic, infrared, or semiconductor system (or apparatus or device), or a propagation medium. Examples of a computer-readable medium include a semiconductor or solid state memory, magnetic tape, a removable computer diskette, a random access memory (RAM), a read-only memory (ROM), a rigid magnetic disc, and an optical disc. Current examples of optical discs include a compact disc with read only memory (CD-ROM), a compact disc with read/write (CD-R/W), a digital video disc (DVD), and a Blu-ray disc.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A non-transitory computer-readable storage medium comprising instructions that, when executed by a processor, enable a graphical user interface to be displayed, wherein the graphical user interface displays information related to room plan generation on a display device, the graphical user interface comprising:

a results window that displays:

a selectable list of generated room plan configuration variants divided into possible room plans and violating room plans, wherein the room plan configuration variants are variations of the same room plan, wherein the selectable list of generated room plan configuration variants comprises a matrix of rows and columns that include numeric values at the intersections of the rows and columns, wherein each column corresponds to a different room plan specification and wherein an entry in the selectable list of generated room plan configuration variants comprises a row in the matrix, the row in the matrix including the numeric values at the intersection of the row in the matrix and each column in the matrix;
a rule violations indicator that displays at least one violated generation rule when a violating room plan is selected from the displayed list of generated room plan configuration variants; and
a room datasheet generation button; and
a visualization window that displays at least one generated room plan configuration variant from the list of generated room plan configuration variants;
wherein selection of an entry in the selectable list of generated room plan configuration variants by a user causes a corresponding room plan configuration to be displayed in the visualization window;
wherein the selectable list of generated room plan configuration variants, the rule violations indicator, and the room datasheet generation button are displayed simultaneously with the at least one generated room plan configuration variant that is displayed in the visualization window.

2. The non-transitory computer-readable storage medium of claim 1, wherein the visualization window displays visualizations of multiple possible room plans from the list of displayed generated room plan configuration variants.

3. The non-transitory computer-readable storage medium of claim 1, wherein the visualization window displays the visualization of a single selected generated room plan configuration variant from the displayed list of generated room plan configuration variants.

4. The non-transitory computer-readable storage medium of claim 1, wherein the results window simultaneously displays:
a design rules tab that, when selected by a user, displays a room layout section and a room components section, wherein the room layout section displays at least one mutable field that indicates specifications of an ideal example room plan on which the generated room plan configuration variants are based; and
a solutions tab that, when selected by a user, displays the selectable list of generated room plan configuration variants;
wherein the user is able to toggle between the room layout section and the room components section corresponding to the design rules tab and the selectable list of generated room plan configuration variants corresponding to the solutions tab by selecting either the design rules tab or the solutions tab.

5. The non-transitory computer-readable storage medium of claim 4, wherein the room components section displays at least one text box that corresponds to a room component added to an ideal example room plan on which the generated room plan configuration variants are based.

6. A computer-implemented method for displaying information related to room plan generation on a display device, the computer-implemented method comprising:
displaying a results window that displays:
a selectable list of generated room plan configuration variants divided into possible room plans and violating room plans, wherein the room plan configuration variants are variations of the same room plan, wherein the selectable list of generated room plan configuration variants comprises a matrix of rows and columns that include numeric values at the intersections of the rows and columns, wherein each column corresponds to a different room plan specification and wherein an entry in the selectable list of generated room plan configuration variants comprises a row in the matrix, the row in the matrix including the numeric values at the intersection of the row in the matrix and each column in the matrix;
a rule violations indicator that displays at least one violated generation rule when a violating room plan is selected from the displayed list of generated room plan configuration variants; and
a room datasheet generation button; and
displaying a visualization window that displays at least one generated room plan configuration variant from the list of generated room plan configuration variants;
wherein selection of an entry in the selectable list of generated room plan configuration variants by a user causes a corresponding room plan configuration to be displayed in the visualization window;
wherein the selectable list of generated room plan configuration variants, the rule violations indicator, and the room datasheet generation button are displayed simultaneously with the at least one generated room plan configuration variant that is displayed in the visualization window.

7. The computer-implemented method of claim 6, wherein displaying the visualization window displays visualizations of multiple possible room plans from the list of displayed generated room plan configuration variants.

8. The computer-implemented method of claim 6, wherein displaying the visualization window displays the visualization of a single selected generated room plan configuration variant from the displayed list of generated room plan configuration variants.

9. The computer-implemented method of claim 6, wherein displaying the results window comprises simultaneously:
displaying a design rules tab that, when selected by a user, displays a room layout section and a room components section, wherein the room layout section displays at least one mutable field that indicates specifications of an ideal example room plan on which the generated room plan configuration variants are based; and
displaying a solutions tab that, when selected by a user, displays the selectable list of generated room plan configuration variants;
wherein the user is able to toggle between the room layout section and the room components section corresponding to the design rules tab and the selectable list of generated room plan configuration variants corresponding to the solutions tab by selecting either the design rules tab or the solutions tab.

10. The computer-implemented method of claim 9, wherein the room components section displays at least one text box that corresponds to a room component added to an ideal example room plan on which the generated room plan configuration variants are based.

11. A system, comprising:
a processor;
a memory;
a display device for displaying information related to room plan generation via a graphical user interface, the graphical user interface comprising:
a results window that displays:
a selectable list of generated room plan configuration variants divided into possible room plans and violating room plans, wherein the room plan configuration variants are variations of the same room plan, wherein the selectable list of generated room plan configuration variants comprises a matrix of rows and columns that include numeric values at the intersections of the rows and columns, wherein each column corresponds to a different room plan specification and wherein an entry in the selectable list of generated room plan configuration variants comprises a row in the matrix, the row in the matrix including the numeric values at the intersection of the row in the matrix and each column in the matrix;
a rule violations indicator that displays at least one violated generation rule when a violating room plan is selected from the displayed list of generated room plan configuration variants; and
a room datasheet generation button; and
a visualization window that displays at least one generated room plan configuration variant from the list of generated room plan configuration variants;
wherein selection of an entry in the selectable list of generated room plan configuration variants by a user causes a corresponding room plan configuration to be displayed in the visualization window;
wherein the selectable list of generated room plan configuration variants, the rule violations indicator, and the room datasheet generation button are displayed simultaneously with the at least one generated room plan configuration variant that is displayed in the visualization window.

12. The system of claim 11, wherein the results window simultaneously displays:
a design rules tab that, when selected by a user, displays a room layout section and a room components section, wherein the room layout section displays at least one mutable field that indicates specifications of an ideal example room plan on which the generated room plan configuration variants are based; and
a solutions tab that, when selected by a user, displays the selectable list of generated room plan configuration variants divided into possible room plans and violating room plans;
wherein the user is able to toggle between the room layout section and the room components section corresponding to the design rules tab and the selectable list of generated room plan configuration variants corresponding to the solutions tab by selecting either the design rules tab or the solutions tab.

* * * * *